United States Patent [19]

Watkins

[11] Patent Number: 4,634,623
[45] Date of Patent: Jan. 6, 1987

[54] CONDUCTIVE ELASTOMERIC INK COMPOSITION

[75] Inventor: Richard L. Watkins, Westminster, Colo.

[73] Assignee: The Gates Corporation, Denver, Colo.

[21] Appl. No.: 698,058

[22] Filed: Feb. 4, 1985

Related U.S. Application Data

[62] Division of Ser. No. 515,823, Jul. 18, 1983, Pat. No. 4,518,833.

[51] Int. Cl.[4] .............................................. B32B 3/00
[52] U.S. Cl. .................................... 428/208; 428/901; 428/209; 252/513; 524/440
[58] Field of Search .............. 252/513; 200/5 R, 5 A, 200/159 B, 329, 340, 302, 265; 524/439, 440; 106/20; 428/901, 208, 195, 209

[56] References Cited

U.S. PATENT DOCUMENTS

| | | |
|---|---|---|
| 4,093,563 | 6/1978 | Eaton ................................... 252/513 |
| 4,138,369 | 2/1979 | Arai et al. .......................... 252/513 |
| 4,258,100 | 3/1981 | Fujitani et al. ..................... 252/513 |
| 4,264,477 | 4/1981 | Seeger et al. ...................... 252/503 |
| 4,292,261 | 9/1981 | Kotani et al. ....................... 252/513 |
| 4,302,361 | 11/1981 | Kotani et al. ..................... 252/513 |
| 4,323,740 | 4/1982 | Balash .............................. 200/159 B |

Primary Examiner—Josephine L. Barr
Attorney, Agent, or Firm—C. H. Castleman, Jr.; H. W. Oberg, Jr.; Frank P. Grassler

[57] ABSTRACT

A conductive elastomeric ink is described comprised of very fine nickel particles admixed in a silicone binder. The ink has utility in elastomeric switch control devices, printed circuits and the like.

13 Claims, 6 Drawing Figures

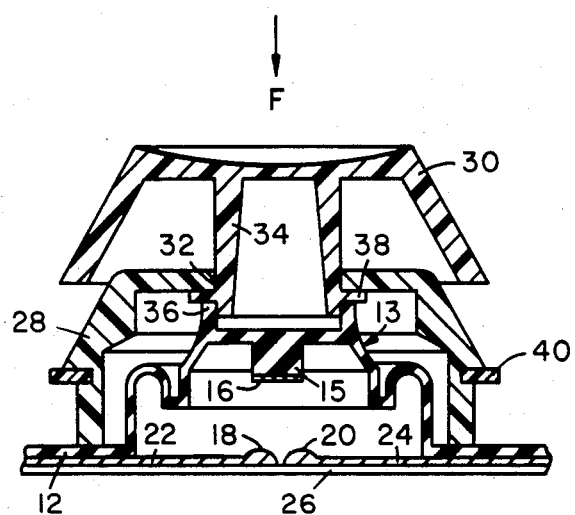
FIG. 4
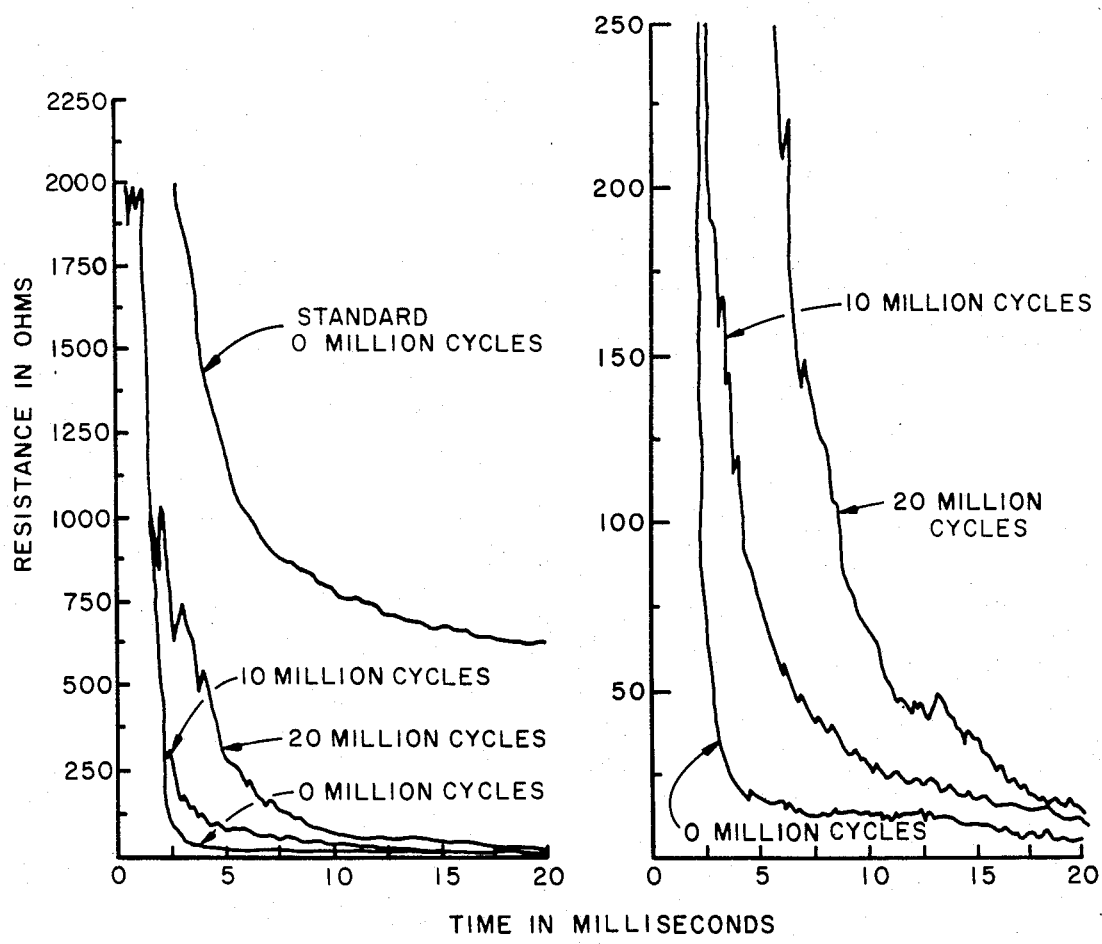
FIG. 5a
FIG. 5b

CONDUCTIVE ELASTOMERIC INK COMPOSITION

This is a division of application Ser. No. 515,823, filed July 18, 1983, now U.S. Pat. No. 4,518,833.

BACKGROUND OF THE INVENTION

This invention relates to electrically conductive elastomeric ink compositions, particularly for use in electrical and electronic circuitry and keyboard switches and assemblies. More particularly, the invention is directed to switch arrays wherein one or more of the switch contacts or conductive traces on a printed circuit board are defined by a novel conductive ink.

An increasing number of keyboards are being provided with switch control devices formed of elastomeric springs, typically as an array of silicone rubber domes. The underside of the dome has a protrusion or contactor portion provided with an outer conductive dot or layer. Upon depressing a key the conductive dot shorts a pair of contacts formed on a printed circuit board or other substrate which the individual key switch assembly overlies. Switch assemblies of this type are disclosed in commonly assigned copending U.S. patent application Ser. No. 479,540, filed Mar. 28, 1983.

Although the prior art recognizes the possibility of using electroconductive printing inks to form the conductive dots on switch contactors, adhesion of the ink to addition cured silicone polymers is difficult, particularly when the ink contains a high loading of conductive fillers. In commercial practice printing processes have not been used for this purpose to Applicant's knowledge, but rather conductive polymers, for instance epoxy loaded with silver flake or silicone loaded with carbon black, have been cured in sheets and then individual conductive dots punched from the sheet and manually bonded with an adhesive to the contactor protrusions on the underside of the domed silicone spring. Alternatively, molded conductive dot layers had been placed in a mold and comolded with the elastomeric spring. These processes are not only labor intensive but the conductive dot compositions suffer from relatively low electrical conductivity and oftentimes suffer from excessive contact bounce.

U.S. Pat. No. 4,264,477 (Seeger et al.) discloses an electrically conductive ink which may be screened and may be employed either as the contactor or contacts for a keyboard switch array. The ink composition comprises −325 mesh (or 44 micron) silver or other metal particle, e.g., nickel, or metal coated particles e.g., silver coated copper or silver coated glass, in admixture with a polyester, epoxy or vinyl polymeric binder and from 0.5 to about 12.5 percent of carbon black powder to provide reduced bounce during low current operation.

The prior art also discloses molded variable resistance devices comprising silicone rubber loaded with fine particulate materials such as carbon, tungsten and nickel-chromium. U.S. Pat. No. 3,918,020 (DuRocher) teaches such molded resistors formed from 7 parts by weight 140-200 mesh nichrome per 1 part of silicone rubber. Additional pressure-sensitive elastic resistor compositions are taught in U.S. Pat. Nos. 4,028,276 to Harden et al and 4,152,304 to Tadewald.

The present invention has as its primary object the provision of a flexible, elastomeric conductive ink composition of high conductivity. Another object is to provide such a composition which is compatible with, and adherent to or which can be made adherent to with an interlayer, a silicone elastomer substrate. Another object is to provide such a conductive composition which can be used as an inexpensive screening ink for printing circuit boards or the like. It is a further object to provide such composition which has a reduced cost by utilizing a minimum amount of conductive metal particles, which can be processed easily, and which has long life and minimal bounce even after millions of contact cycles.

SUMMARY OF THE INVENTION

In one aspect, the invention comprehends an electrically conductive elastomeric ink composition which comprises an elastomeric cured silicone binder and finely divided nickel particles interspersed in the binder in an amount from about 25 to about 90 percent by weight based on the weight of the composition. By using nickel particles having a size in the range from about 0.05 to about 32 microns an unusually processable solution of low viscosity is provided, and the dried ink composition exhibits superior conductivity.

In another aspect the invention pertains to a flexible switch control device, such as an elastomeric dome, having a movable contactor portion carrying a layer of the aforementioned ink composition intimately adhered thereto.

In a further embodiment the invention is directed to a printed circuit board comprising conductive traces and contacts, at least one of the traces or contacts being comprised of the aforementioned ink composition.

In still a further aspect, the invention comprehends a keyboard assembly including a printed circuit board with traces and contacts, and a series of key switch assemblies overlying the contacts of the printed circuit board. The conductive traces, contacts or contactor portions of the assembly comprise the electrically conductive ink composition aforementioned.

BRIEF DESCRIPTION OF THE DRAWINGS

The invention in its preferred embodiments will be more particularly described by reference to the accompanying drawings, in which like parts are designated by like numerals in the various figures, and in which:

FIG. 4 depicts an elevational sectional view of a switch assembly forming a portion of a keyboard; and FIGS. 5a and 5b are contact bounce plots comparing uncycled and cycled switch pads of FIGS. 1 and 2 employing the ink composition of the invention, with a commercially available uncycled silicone switch pad.

PREFERRED EMBODIMENTS OF THE INVENTION

Figure 1:
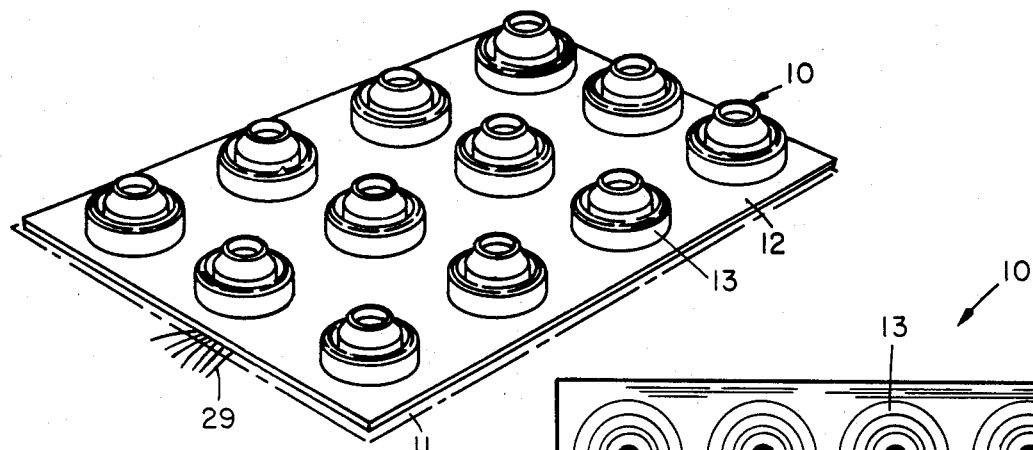
FIG. 1 is a perspective view of an elastomeric switch pad having multiple switch control elements integrally joined together for use in a keyboard.

The conductive elastomeric ink composition of the invention comprises a silicone binder and finely divided nickel particles interspersed throughout the binder phase. Typically the ink is formed by diluting the silicone base with an appropriate solvent, mixing in the conductive particles to form a homogeneous mixture, applying the ink to a substrate, and allowing the ink to dry whereby the solvent is driven off or evaporated, the remainder being essentially the binder solids and interspersed nickel particles.

The polymeric binder is formed of a thermosetting silicone, cross-linked elastomer. Although the silicone base may be formed by peroxide or other curing methods, addition cured silicones are presently preferred. Addition cured silicone polymers are normally formed by reacting a polyhydrosiloxane with a poly vinyl siloxane, e.g., poly methyl vinyl siloxane or poly phenyl vinyl siloxane, in the presence of a suitable catalyst. Typically a platinum catalyst such as chloroplatinic acid may be utilized, preferably with an inhibitor to control the reaction temperature. Typical inhibitors for use with platinum catalysts include suitable peroxides, and a hindered hydroxy alkyne or alkene.

Especially suitable silicone binders are the addition cured elastomeric silicone polymers which, during curing, undergo a linear shrinkage of at least about 3 percent, more preferably at least about 6 percent. Other suitable silicone systems and methods for their preparation will be appreciated by those skilled in this art.

The binder is formed as a solution by addition of a diluent or solvent, usually a high hydrocarbon solvent preferably xylenes. Desirably the solvent is added to the reactive siloxane components prior to completion of the polymerization action to form the silicone base. Sufficient solvent is added to reach a desired viscosity, e.g., from about 50 to about 500 centipoise.

It has been found in accordance with the invention that only finely divided nickel-filled silicone ink offers the unique combination of low viscosity (to meet printing operation requirements), high conductivity of the dried ink composition, strong adherence to the substrate, and low cost. While the noble metal inks, particularly silver, gold or platinum conductive particles in silicone have been found to provide high conductivity, they suffer from high cost, high solution viscosity rendering printing difficult or impossible, or the tendency to form oxide coatings which reduces conductivity of the final ink composition. Other metals tested produced one or more of the aforementioned drawbacks when blended into silicone based ink compositions.

The size of the nickel particles has been found to be critical. The nickel particles must be finely divided and preferably have a size in the range from about 0.05 to about 32, more preferably from about 0.1 to about 10, and most preferably from about 0.1 to about 1.0 microns. Particles sizes substantially above the preferred range, e.g., −325 mesh particles, produce either nonconductive inks, or require extremely high nickel loading to achieve acceptable conductivities. However, the high nickel loading produces an unacceptably high stiffness to the ink solution making processing impossible or at least difficult, in addition to higher cost. By using small sized particles, the amount of nickel used in the composition is from about 25 to about 90, more preferably from about 30 to about 80 and most preferably from about 40 to about 70 percent by weight based on the weight of the composition.

Compositions of finely divided nickel in silicone binder solutions in accordance with the invention have viscosities desirably in the range from about 100 to about 10,000 centipoise making them easily applied to a nonconductive substrate, e.g., by brushing, dipping, screening or by flexographic or transfer printing. Although the ink compositions of the invention are ideally suited as coatings on silicone substrates because of the strong adhesion therebetween, the inks may also be applied to various other substrate surfaces either directly, or by use of a suitable primer such as a reactive siloxane or silane, or by other treatment of the substrate surface for improved adhesion.

After the conductive ink has been applied to the substrate, the composition is cured preferably by heating within the range from about 150 to about 300, more preferably from about 200 to about 250° C. for a sufficient period to produce a cross-linked elastomeric silicone base. Typical cure times are from about 10 to about 30 minutes although this will depend upon the curing temperature.

Although not completely understood, it is theorized that the finely divided nickel/silicone ink compositions of the invention exhibit very high conductivities with low metal loading by virtue of a reduced wetting of the silicone on the fine nickel particles, compared to various other conductive metals, and increased surface area. The ability of an elastomer to wet hard particles, known as the interaction parameter, is discussed in depth in U.S. Pat. No. 4,028,276 (to Harden et al.).

It has also been found that the amount of nickel based on the weight of the ink composition can be reduced still further, without sacrifice in conductivity of the ink, by incorporating the nickel as a coating of particles on a particulate substrate. The substrate may be nonconductive or conductive, and is preferably conductive carbonaceous particles, most preferably graphite. While the nickel particles themselves are in the aforementioned range from about 0.05 to about 32 microns, preferably 0.05 to about 5 microns, the composite nickel-coated graphite may typically be of a size from about −400 mesh to about −100 mesh. The weight of nickel based on weight of the coated particle is generally from about 60 to about 95 percent, more preferaly from about 70 to about 90 percent.

Figure 2:
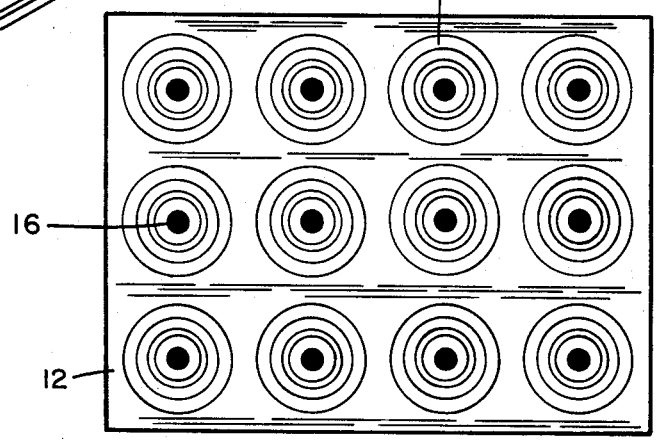
FIG. 2 is a bottom plan view of the switch pad 12 of FIG. 1.

The conductive ink of the invention is particularly suited for applications requiring flexing of the ink and/or substrate to which it is attached. A preferred application is in keyboards and components thereof, particularly keyboard switches as illustrated in the accompanying drawings. Referring first to FIGS. 1 and 2, there is shown a switch control device more fully described in the aforementioned commonly assigned U.S. Ser. No. 479,540. Accordingly, a 3×4 array switch pad shown generally at 10 may be provided with individual switch control elements 13 joined together in spaced relationship by attachment to a common base 12. Base 12 and elements 13 may be molded integrally of a suitable elastomer, such as addition cured silicone. The particular matrix shown in FIGS. 1 and 2 may serve as the spring control portion for a telephone keyboard, adapted to be placed in overlying juxtaposition to the printed circuit board 11 of FIG. 3.

As seen in FIGS. 2 and 4, the underside of each switch control element 13 is provided with a central protrusion 15, the height of which determines the amount of overtravel of the key, and to which is firmly attached an outer layer or layers of the conductive ink composition 16 of the invention, in the form of a dot. Layer 16 may typically be from about 0.003 to about 0.015 inches (0.08–0.38 mm) thick. Conductive layer 16 thereby serves as the contactor portion of the switch device and is movable by virtue of connection to the elastomeric domed switch control device 13, toward underlying pair of contacts 18, 20, which are respectively connected to conductor paths 22, 24. Contacts 18, 20 and conductor paths or traces 22, 24 are attached or bonded to an insulating substrate or base surface 26. The conductive traces and contacts together may form a printed circuit board.

The key assembly of FIG. 4 further includes a key holder or housing 28 which clamps base portions 12 of the control element 13 against the underlying printed circuit board, and serves as a guide for the actuating key top 30. Key holder 28 is provided with a central aperture 32 which slidingly receives key stem 34, which may be integral with key top 30, depressible by the operator employing force F. Sufficient clearance is provided between the under surface of key top 30 and the top surface of the key holder housing 28 to allow full travel of control member 13 including the desired amount of overtravel. The spring control member 13 is coupled to key top 30 by a close fit between the depending portion of stem 34 and upstanding cylinder 36 of the control device. The lower portion of the stem 34 may be bonded to portion 36 to prevent detachment. Stem flange portion 38 may be provided for further stability to ensure proper axial alignment. Substantial side clearance is provided beween the outer surface of control element 13 and the adjacent inner will of housing 28 to allow substantially unobstructed bulging of the sidewall of control element 13 upon depression of the key top.

Key housing 28, which may be one key of an array of keys, may be mounted in a horizontally disposed cover plate or bezel 40. The key switch assembly of FIG. 4, which is suitable for data entry terminals, typewriters and the like, is just one example of a switch assembly for which the conductive ink of the invention may advantageously be used.

Figure 3:
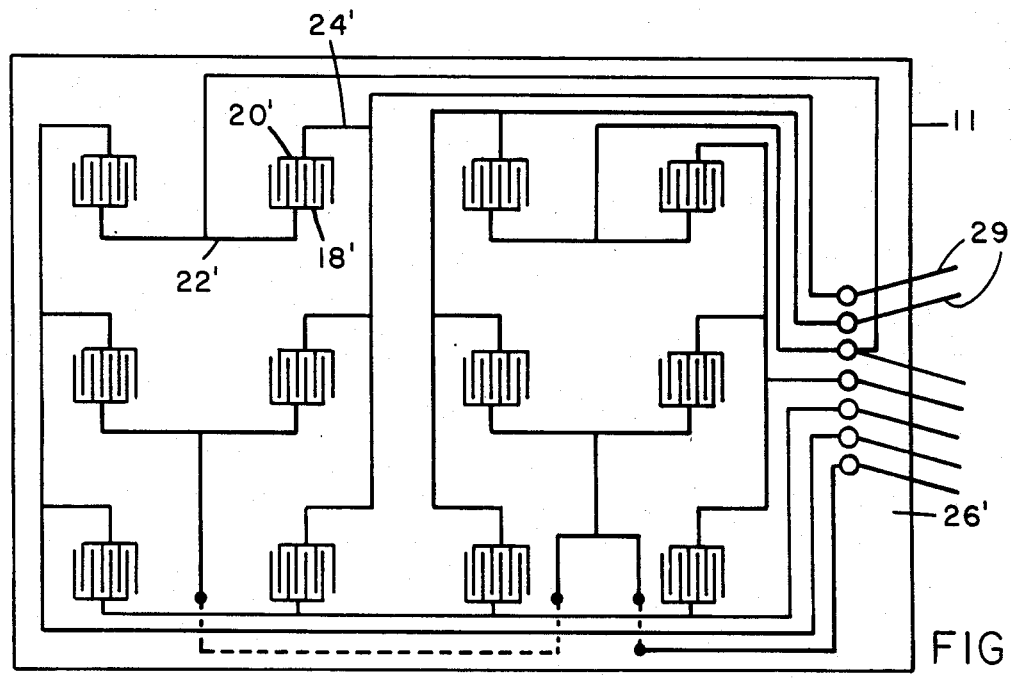
FIG. 3 illustrates in top plan view a printed circuit board using the conductive ink of the invention, the contacts of which are adapted to underlie the corresponding contactors of the switch pad of FIGS. and 1 and 2.

An example of a printed circuit board employing the conductive ink of the present invention is shown in FIG. 3. This printed circuit board is adapted for use in a touch tone telephone keyboard, underlying an array of switch control devices such as shown in FIGS. 1 and 2. The PC board includes a nonconductive base 26' formed of any suitable insulative material such as glass filled epoxy, silicone elastomer, or polyester. Onto the insulated base 26' is imprinted preferably by screen printing twelve pairs of nested contacts 18', 20', respectively interconnected to conductive traces 22', 24'. Either the contacts, conductive traces, or both are formed of the conductive ink of the invention, of sufficient width and thickness to meet the particular application.

The circuit lines of FIG. 3 may terminate by connection to the normal terminal leads 29, alternatively attached to terminal pins, or the like. When the circuit board of FIG. 3 is assembled in association with the switch control device of FIGS. 1 and 2, when the individual switch control element 13 is depressed by the operator sufficiently, contactor dot 16 shorts across contacts 18', 20' to complete a circuit which results in generation of a corresponding signal applied to control circuitry, in known manner.

The invention will be further described in respect to the following working examples.

EXAMPLE I

To a tall form beaker was added 35 g each of DC Q39595 A and B (one of which is a polyhydrosiloxane and the other is a mixture of platinum catalyst and poly methyl vinyl siloxane, manufactured by Dow Corning Corporation) and 60 ml of xylenes. The mixture was stirred until the solution was homogeneous. Using 5 g aliquots of this solution as the ink base, 0.09 moles of the following metallic powders were mixed with the 5 g aliquots and sample pads of approximately 0.5 inches (12.7 mm) thick were prepared by curing for 1 hour at 150° C. The conductivity of the sample pads were measured before and after curing with the results as shown in Table I:

TABLE I

| Metal | Maximum Particle Size, Microns | Weight, Grams | Conductivity, Ohms Uncured | Cured | Remarks |
| --- | --- | --- | --- | --- | --- |
| Aluminum | 1 | 2.30 | No | No | |
| Chromium | 5 | 4.43 | No | No | |
| Cobalt | 3 | 5.0 | No | No | |
| Iron | 3 | 4.8 | No | No | |
| Molybdenum | 2 | 8.2 | No | 15 | Very stiff (inelastic) |
| Nickel | 1 | 5.0 | No (100,000) | 2.5 | Elastic |
| Silver | 1 | 4.6[1] | 2.5 | 2 | Pad very crumbly[4] |
| Tungsten | 1–2 | 15.7 | No | No | |
| Gold | 44 | 1.0[2] | No | 2.5 | Elastic |
| Platinum | 44 | .88[3] | No | 1–2 | Elastic |

[1] 2.5 g binder solution used (corresponding to .09 moles Ag/5 g binder solution)
[2] 0.29 g silicone used (corresponding to .09 moles Au/5 g binder solution)
[3] 0.25 g silicone used (corresponding to .09 moles Pt/5 g binder solution)
[4] Subsequent tests showed that reduced molar ratios of silver provided pads of high conductivity which could be processed.

EXAMPLE II

To 5 g aliquot samples of Example I were added the masses of the following materials as shown in Table II, with the conductivities as shown. None of the samples were suitable for printing since the mixtures were too stiff to produce screenable inks. The disparity in resistances of the various samples cannot be adequately explained.

TABLE II

| Metal | Mesh Size | Corresponding Maximum Particle Size, Microns | Weight, Grams | Conductivity, Ohms Uncured | Cured |
| --- | --- | --- | --- | --- | --- |
| Nickel | −100 to +200 | 74–149 | 15 | No | 30–60 |
| " | −100 to +200 | 74–149 | 20 | No | 3–8 |

TABLE II-continued

| Metal | Mesh Size | Corresponding Maximum Particle Size, Microns | Weight, Grams | Conductivity, Ohms Uncured | Conductivity, Ohms Cured |
|---|---|---|---|---|---|
| " | −100 to +200 | 74–149 | 30 | No | 2.5–4 |
| " | −200 to +325 | 44–74 | 10 | No | No |
| " | −200 to +325 | 44–74 | 15 | No | No (150,000) |
| " | −200 to +325 | 44–74 | 20 | No | 700 |
| " | −325 | 44 | 5 | No | No |
| " | −325 | 44 | 10 | No | No |
| " | −325 | 44 | 15 | No | 500 |
| Nickel-Chromium (80/20) | −325 | 44 | 5 | No | No |
| Nickel-Chromium (80/20) | −325 | 44 | 10 | No | No |
| Nickel-Chromium (80/20) | −325 | 44 | 15 | No | No |
| Nickel-Chromium (80/20) | −325 | 44 | 20 | No | No |

EXAMPLE III

To a 2.5 g aliquot of the binder solution of Example I was added the following quantities of silicon and copper particles and, in accordance with the invention nickel-coated graphite particles, respectively as set out in Table III.

It is clear that the nickel particles coated on graphite, both where the nickel to graphite ratio was 75:25 and 85:15 on a weight basis, provided superior conductivity to the cured sample. The individual nickel particles had a size of about 1-4 microns, and the graphite about 30-100 microns. The viscosity of the ink was sufficiently low to readily permit screen or pad printing.

TABLE III

| Metal | Particle Size, in Mesh or Microns | Weight, Grams | Cured Conductivity, Ohms |
|---|---|---|---|
| Silicon | −325 mesh | 2.53 (0.09 moles) | No |
| " | " | 5.06 | Less than $10^5$ |
| " | " | 7.60 | Less than $10^5$ |
| Copper | 1 micron | 5.7 (0.09 moles) | No |
| " | 1 micron | 11.4 | No |
| " | 1 micron | 17.1 | No |
| " | 1 micron | 22.8 | No |
| " | 1 micron | 28.5 | No |
| Nickel-on-graphite (75/25) | −150 mesh | 2.12[1] | 3–4 |
| Nickel-on-graphite (85/15) | −150 mesh | 2.33[1] | 1–2 |

[1] 2.5 g binder solution used (corresponding to .09 moles Ni—graphite/5 g binder solution)

EXAMPLE IV

The nickel-based ink of Example I, using 5.0 g of 1 micron nickel (0.09 moles) loaded in 3.0 g silicone base diluted with 2.0 g xylenes was prepared. The resultant ink was printed three times on a protrusion 15 of a silicone elastomer switch control member substantially of the same shape as member 13 of FIG. 4 using a 0.005 inch (0.13 mm) deep well etched onto the printing cliche. The resultant layer or dot 16 was approximately 0.015 inch (0.38 mm) thick. The switch control member 13 with the thus coated conductive dot 16 was cured in an oven at 150° C. for one hour.

Contact bounce curves for these switch control devices with the conductive dot of the invention are shown in FIGS. 5a and 5b. FIG. 5b shows resistance in ohms versus time in milliseconds for such switch control devices after 0 cycles of flexing (contact/release cycles, no load) compared with the same devices after 10 and 20 million flex cycles, respectively.

The same curves with an expanded scale are shown in FIG. 5a to compare contact bounce and resistance with a standard, commercially available domed silicone switch control member using a conductive dot 0.040 inch (1.0 mm) thick formed of silicone elastomer loaded with carbon black bonded (co-vulcanized) to the switch control member. As can be seen the standard (uncycled) conductive dot exhibited a resistance greater than 500 ohms after 20 milliseconds. With many new electronic devices being designed to sense a completion of the circuit when the resistance measures approximately 100 ohms or less, the switching device of the invention meets this objective even after 20 million flex cycles, whereas the standard commercially available switching device did not.

While certain representative embodiments and details have been shown for the purpose of illustrating the invention, it will be apparent to those skilled in this art that changes and modifications may be made therein without departing from the spirit or scope of the invention. As an alternative, instead of providing both contacts on the printed circuit board as in FIGS. 3 and 4, the contactor 16 can serve as one of the contacts (connected to an ink trace), and the underlying surface or PC board being printed with the other contact/traces, as in U.S. Pat. No. 4,264,477.

What is claimed is:

1. An electrically conductive elastomeric ink composition which comprises an elastomeric silicone binder and finely divided nickel particles interspersed therein in an amount from about 25 to about 90 percent by weight based on the weight of the composition, the nickel particles having a size in the range from about 0.05 to about 32 microns.

2. The ink of claim 1 wherein the nickel particles have a size in the range from about 0.1 to about 10 microns.

3. The ink of claim 1 wherein the nickel particles have a size in the range from about 0.1 to about 1.0 micron.

4. An electrically conductive elastomeric ink composition comprising an addition cured silicone binder and finely divided nickel particles interspersed therein in an amount from about 25 to about 90 percent by weight based on the weight of the composition, the nickel particles having a size in the range from about 0.1 to about 10 microns, the ink being self-adhered to a nonconductive printed circuit board.

5. The ink of claim 4 wherein the addition cured silicone binder is formed as a solution by the addition of a solvent.

6. The ink of claim 5 wherein the solvent is a high hydrocarbon solvent.

7. The ink of claim 6 wherein the solvent is a xylene.

8. A printed circuit board comprising conductive traces and contacts, at least one of said traces or contacts being comprised of the ink composition of claim 1.

9. The printed circuit board of claim 8 wherein the nickel particles are coated on a carbonaceous particulate substrate.

10. The printed circuit board of claim 9 wherein the substrate is comprised of graphite.

11. The printed circuit board of claim 9 wherein the binder is formed of an addition cured elastomeric silicone which has undergone linear shrinkage of at least about 3 percent during cure, and the ink composition is self-adhered to the printed circuit board.

12. The printed circuit board of claim 9 wherein the binder is formed of an addition cured elastomeric silicone, which has undergone linear shrinkage of at least about 6 percent during cure, and the ink composition being self-adhered to the printed circuit board.

13. The printed circuit board of claim 9 wherein a high hydrocarbon solvent is added to the reactive components of the binder prior to addition cure in sufficient quantities so that the solution has a viscosity of form about 50 to about 500 centipoise.

* * * * *